(12) United States Patent
Owen

(10) Patent No.: US 10,396,627 B2
(45) Date of Patent: Aug. 27, 2019

(54) ELECTRIC MOTOR OR GENERATOR

(71) Applicant: PROTEAN ELECTRIC LIMITED, Surrey (GB)

(72) Inventor: Geoffrey Owen, Farnham (GB)

(73) Assignee: PROTEAN ELECTRIC LIMITED, Surrey (GB)

( * ) Notice: Subject to any disclaimer, the term of this patent is extended or adjusted under 35 U.S.C. 154(b) by 840 days.

(21) Appl. No.: 14/901,166

(22) PCT Filed: Jun. 20, 2014

(86) PCT No.: PCT/IB2014/062483
§ 371 (c)(1),
(2) Date: Dec. 28, 2015

(87) PCT Pub. No.: WO2014/207637
PCT Pub. Date: Dec. 31, 2014

(65) Prior Publication Data
US 2016/0156253 A1    Jun. 2, 2016

(30) Foreign Application Priority Data
Jun. 26, 2013 (GB) .................................. 1311393.1

(51) Int. Cl.
*H02K 11/27* (2016.01)
*H02K 11/33* (2016.01)
(Continued)

(52) U.S. Cl.
CPC ................ *H02K 9/19* (2013.01); *B60L 3/003* (2013.01); *B60L 3/0061* (2013.01);
(Continued)

(58) Field of Classification Search
CPC ...... H02K 11/20; H02K 11/215; H02K 11/27; H02K 11/33; H02K 15/14; H02K 21/22; H02K 29/08; H02K 9/19
See application file for complete search history.

(56) References Cited

U.S. PATENT DOCUMENTS

2006/0125240 A1   6/2006   Kato et al.
2006/0152095 A1   7/2006   Kikuchi et al.

FOREIGN PATENT DOCUMENTS

GB   2462948 A   3/2010
GB   2494797 A   3/2013
(Continued)

OTHER PUBLICATIONS

Machine Translation of Denso [JP 2003 274606 A], Sep. 26, 2003.*
(Continued)

*Primary Examiner* — Bernard Rojas
(74) *Attorney, Agent, or Firm* — Nolte Intellectual Property Law Group

(57) ABSTRACT

An electric motor or generator comprising a stator with at least one coil winding, wherein the stator includes a first surface having a section of the at least one coil winding extending in a direction away from the first surface, and a control module having a housing with a first side that is arranged to be mounted to the first surface of the stator, wherein the housing includes a first element for detecting current flow, and a control device for controlling current flow in the at least one coil winding based upon the current flow detected by the first element, wherein the section of the at least one coil winding that is arranged to extend away from the first surface is arranged to extend through an aperture formed on the first side of the housing for coupling to the control device, wherein the first element is mounted in the housing adjacent to the aperture.

11 Claims, 7 Drawing Sheets

(51) Int. Cl.
*H02K 11/215* (2016.01)
*H02K 9/19* (2006.01)
*H02K 9/22* (2006.01)
*H02K 11/20* (2016.01)
*H02K 5/20* (2006.01)
*H02K 15/14* (2006.01)
*B60L 3/00* (2019.01)
*B60L 15/00* (2006.01)
*H02K 7/14* (2006.01)
*H02K 21/22* (2006.01)
*H02K 29/08* (2006.01)

(52) U.S. Cl.
CPC .............. *B60L 15/007* (2013.01); *H02K 5/20* (2013.01); *H02K 9/22* (2013.01); *H02K 11/20* (2016.01); *H02K 11/215* (2016.01); *H02K 11/27* (2016.01); *H02K 11/33* (2016.01); *H02K 15/14* (2013.01); *B60L 2220/12* (2013.01); *B60L 2220/14* (2013.01); *B60L 2220/16* (2013.01); *B60L 2220/58* (2013.01); *B60L 2240/425* (2013.01); *B60L 2240/525* (2013.01); *B60L 2270/145* (2013.01); *H01L 2224/49111* (2013.01); *H02K 7/14* (2013.01); *H02K 21/22* (2013.01); *H02K 29/08* (2013.01); *Y02T 10/641* (2013.01); *Y02T 10/645* (2013.01)

(56) References Cited

FOREIGN PATENT DOCUMENTS

| | | |
|---|---|---|
| JP | 2003274606 A | 9/2003 |
| WO | 2013059027 A1 | 4/2013 |
| WO | 2013118670 A1 | 8/2013 |

OTHER PUBLICATIONS

European Patent Office; International Search Report; dated Jun. 30, 2015; World Intellectual Property Organization; Rijswijk.

Intellectual Property Office; Search Report First; dated Sep. 20, 2013; Intellectual Property Office; South Wales.

European Patent Office; Written Opinion of the International Search Authority; dated Dec. 26, 2015; World Intellectual Property Organization; Rijswijk.

\* cited by examiner

ELECTRIC MOTOR OR GENERATOR

The present invention relates to an electric motor or generator, in particular a control module for an electric motor or generator.

Electric motor systems typically include an electric motor and a control unit arranged to control the power of the electric motor. Examples of known types of electric motor include the induction motor, synchronous brushless permanent magnet motor, switched reluctance motor and linear motor. In the commercial arena three phase electric motors are the most common kind of electric motor available.

A three phase electric motor typically includes three coil sets, where each coil set is arranged to generate a magnetic field associated with one of the three phases of an alternating voltage.

To increase the number of magnetic poles formed within an electric motor, each coil set will typically have a number of coil sub-sets that are distributed around the periphery of the electric motor, which are driven to produce a rotating magnetic field.

By way of illustration, FIG. 1 shows a typical three phase electric motor 10 having three coil sets 14, 16, 18. Each coil set consists of four coil sub-sets that are connected in series, where for a given coil set the magnetic field generated by the respective coil sub-sets will have a common phase.

The three coil sets of a three phase electric motor are typically configured in either a delta or wye configuration.

A control unit for a three phase electric motor having a DC power supply will typically include a three phase bridge inverter that generates a three phase voltage supply for driving the electric motor. Each of the respective voltage phases is applied to a respective coil set of the electric motor.

A commonly used control technique for a multiphase electric motor is that of field oriented control FOC. FOC is based on projections that transform a two co-ordinate time invariant system into a three phase time and speed dependent system and vice versa, where a stator current or voltage component is aligned with a quadrature axis q and a magnetic flux component is aligned with a direct axis d.

For a multi phase electric motor, FOC requires that the stator phase current (i.e. the current flow in the individual stator coil windings) be measured and converted to a complex space vector coordinate system.

Accordingly, for a control unit arranged to control current flow in a multiphase electric motor using FOC, the control unit will typically require the use of a current feedback loop.

A current feedback loop typically utilises a current sensor within the control unit for determining the current flow within the electric motor's coil windings.

However, due to the effects of capacitance and inductance associated with an electric motor, the greater the distance the control unit is located from the electric motor the greater the chance that the current flow measured at the control unit will be different to the current flow in the electric motor's coil windings mounted on the electric motor's stator, which can result in the control unit generating incorrect torque values.

It is desirable to improve this situation

In accordance with an aspect of the present invention there is provided an electric motor or generator according to the accompanying claims.

The present invention provides the advantage of allowing the current flow within coil windings of an electric motor to be measured on a portion of the coil winding adjacent to the stator tooth that the coil winding is wound upon. Additionally, by having the current measuring means close to the current controlling device this allows the overall inductance of the electric motor to be reduced while also allowing the control module housing to provide environmental protection to the current measuring means. For an electric motor having two sub-motors the present invention allows a single control module to be used to measure the current flow in the coil windings for both sub-motors and accordingly control the current flow in both sub-motors.

The present invention will now be described, by way of example, with reference to the accompanying drawings, in which.

The embodiment of the invention described is for a control module for an electric motor, where the electric motor is for use in a wheel of a vehicle. However the electric motor may be located anywhere within the vehicle. The motor is of the type having a set of coils being part of the stator for attachment to a vehicle, radially surrounded by a rotor carrying a set of magnets for attachment to a wheel. For the avoidance of doubt, the various aspects of the invention are equally applicable to an electric generator having the same arrangement. As such, the definition of electric motor is intended to include electric generator. In addition, some of the aspects of the invention are applicable to an arrangement having the rotor centrally mounted within radially surrounding coils. As would be appreciated by a person skilled in the art, the present invention is applicable for use with other types of electric motors.

Figure 1:
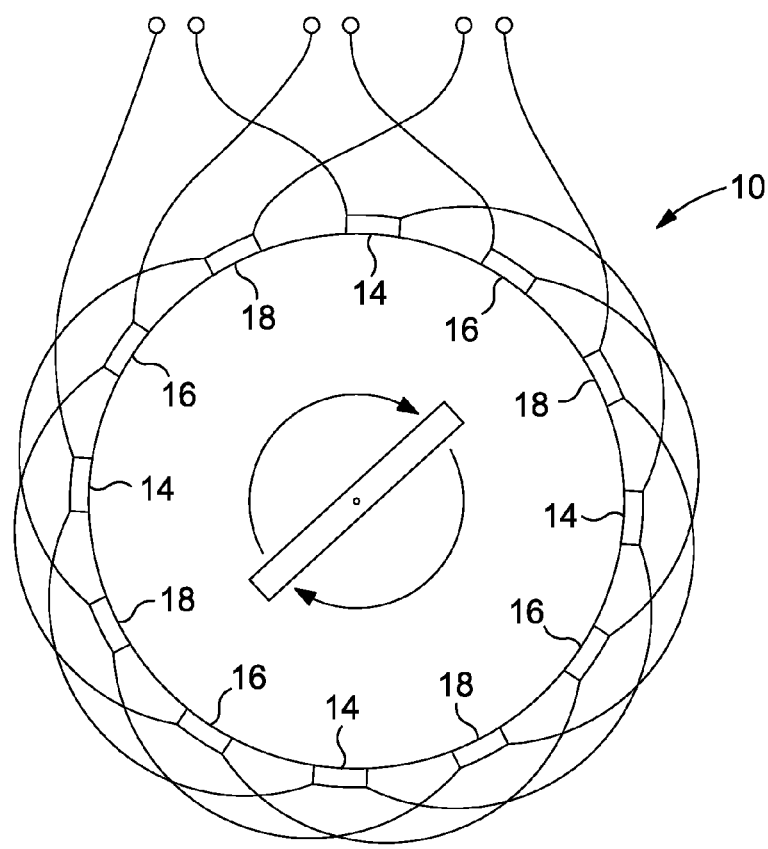
FIG. 1 illustrates a prior art three phase electric motor.
Figure 2:
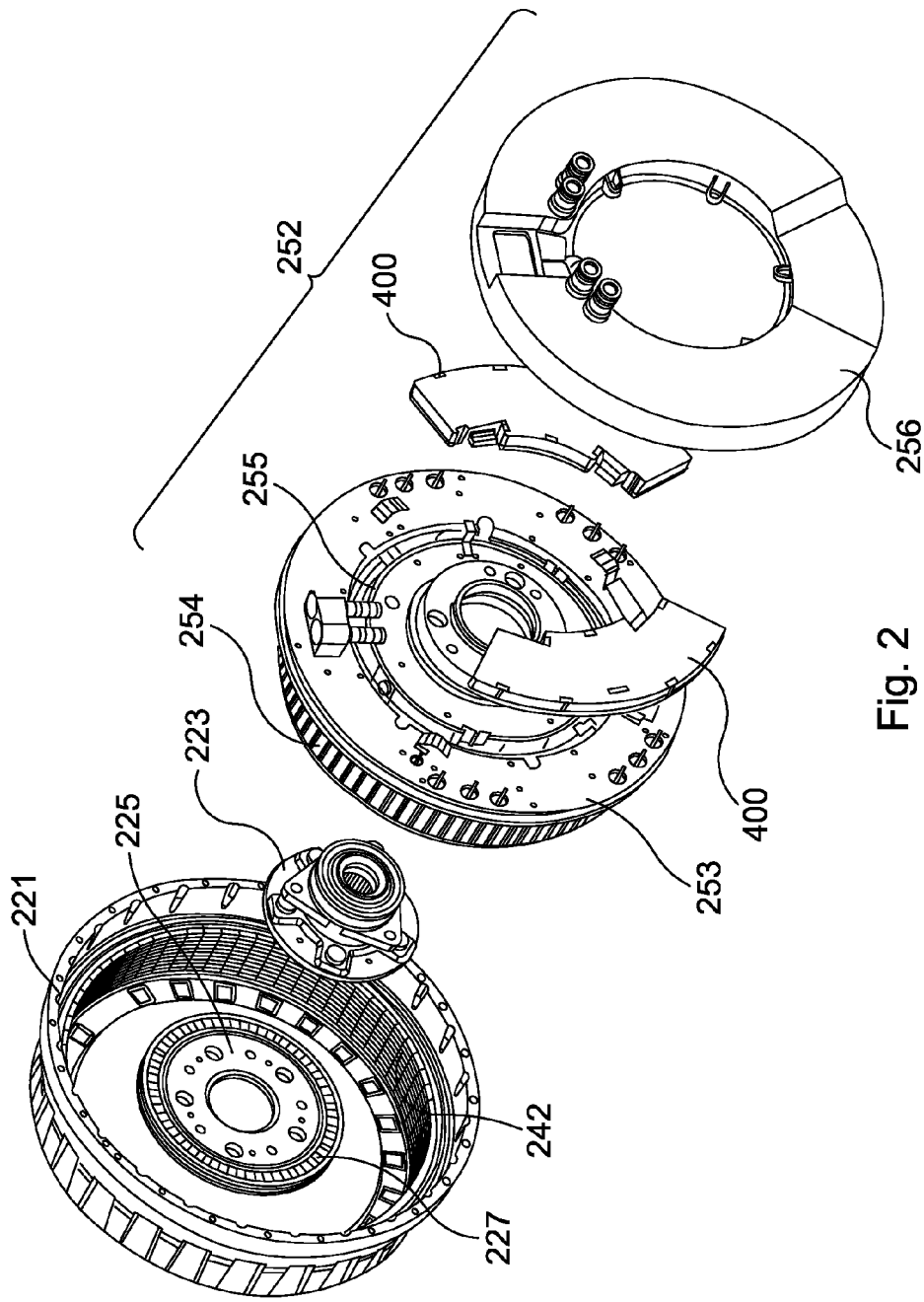
FIG. 2 illustrates an exploded view of a motor embodying the present invention.
Figure 3:
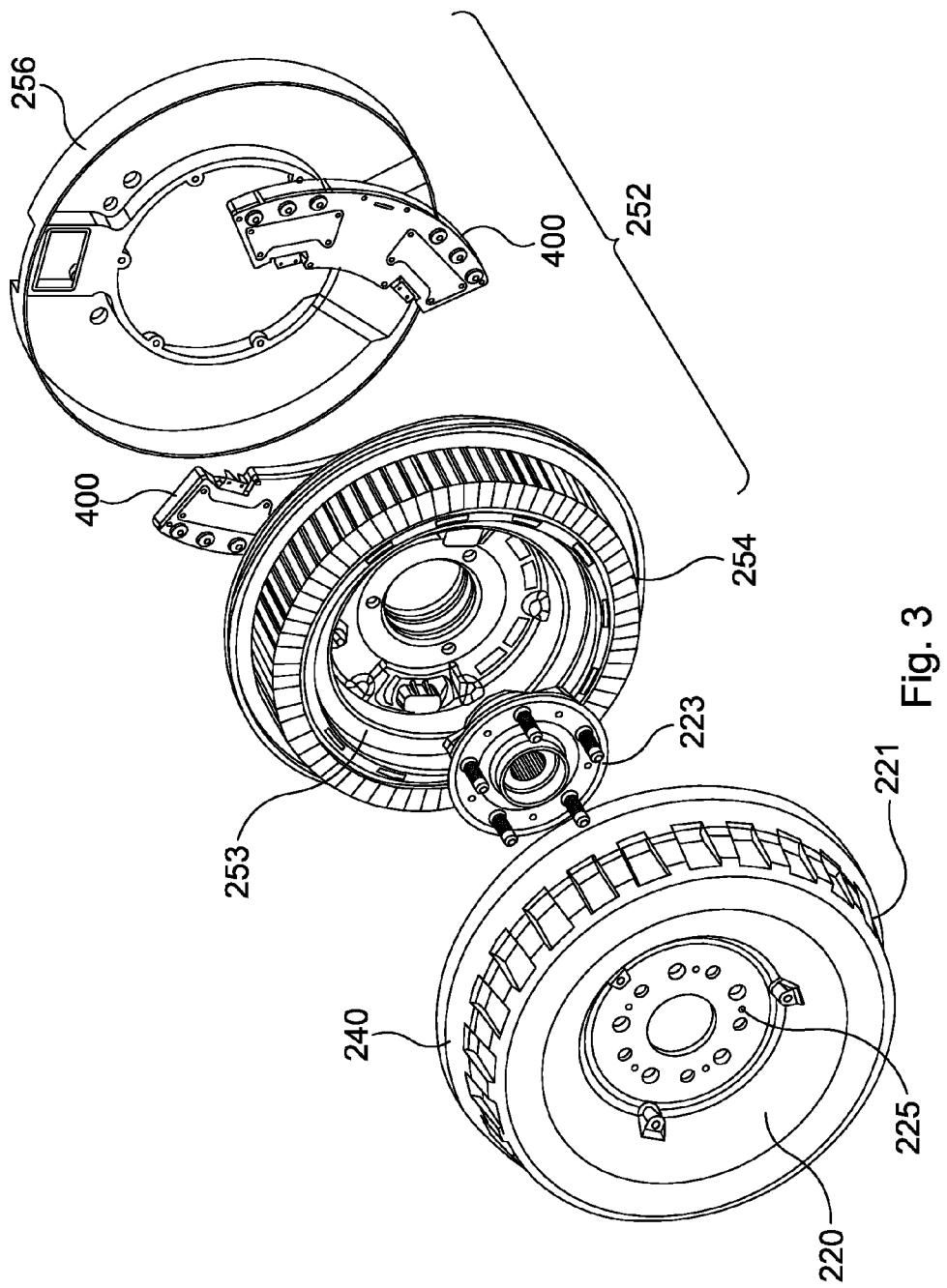
FIG. 3 illustrates an exploded view of the electric motor shown in FIG. 1 from an alternative angle.

For the purposes of the present embodiment, as illustrated in FIG. 2 and FIG. 3, the in-wheel electric motor includes a stator 252 comprising a heat sink 253, multiple coils 254, two control modules 400 mounted on the heat sink 253 on a rear portion of the stator for driving the coils, and an annular capacitor mounted on the stator within the inner radius of the two control modules 400. The coils 254 are formed on stator tooth laminations to form coil windings, where the stator tooth laminations are mounted on the heat sink. A stator cover 256 is mounted on the rear portion of the stator 252, enclosing the control modules 400 to form the stator 252, which may then be fixed to a vehicle and does not rotate relative to the vehicle during use.

Figure 4:
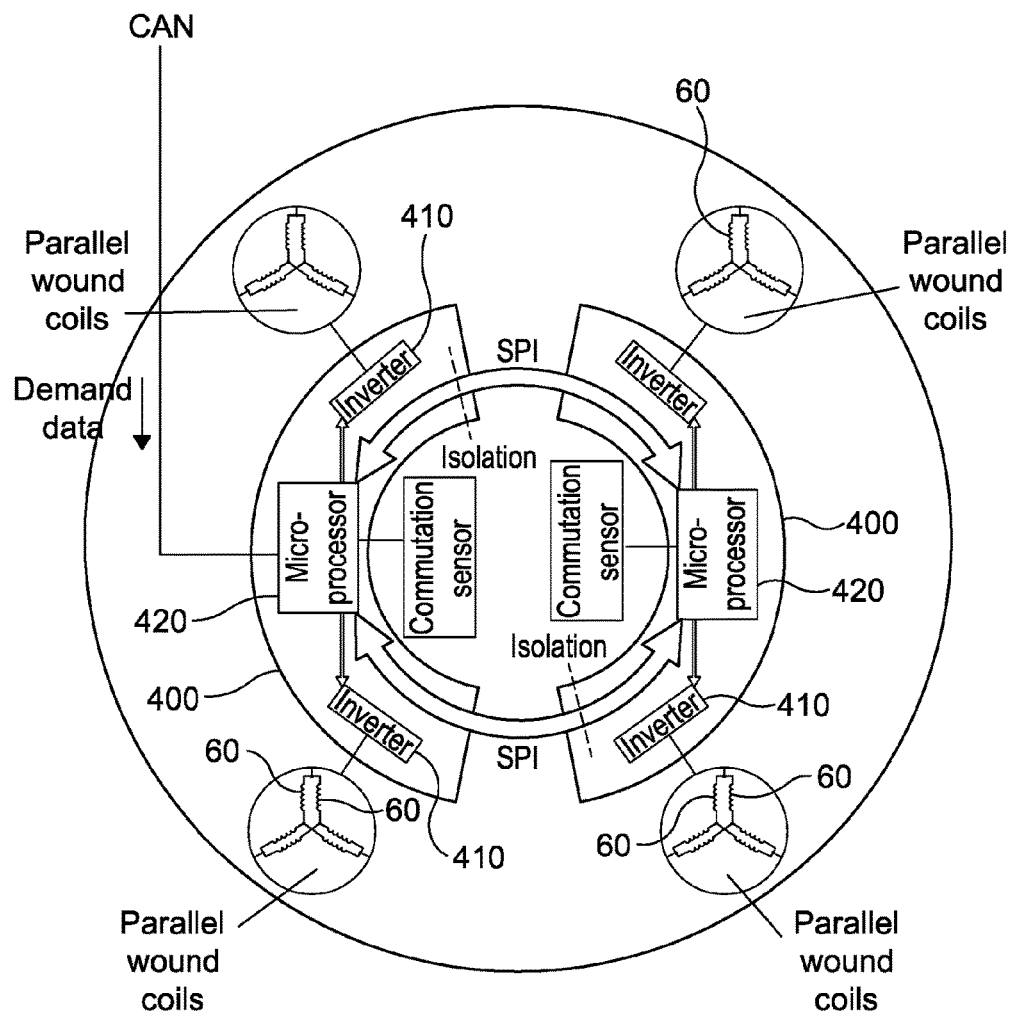
FIG. 4 illustrates an electric motor according to an embodiment of the present invention.

Each control module 400 includes two inverters 410 and control logic 420, which in the present embodiment includes a processor, for controlling the operation of the inverters 410, which is schematically represented in FIG. 4.

The annular capacitor is coupled across the inverters 410 and the electric motor's DC power source for reducing voltage ripple on the electric motor's power supply line, otherwise known as the DC busbar, during operation of the electric motor. For reduced inductance the capacitor is mounted adjacent to the control modules 400.

A rotor 240 comprises a front portion 220 and a cylindrical portion 221 forming a cover, which substantially surrounds the stator 252. The rotor includes a plurality of permanent magnets 242 arranged around the inside of the cylindrical portion 221. For the purposes of the present embodiment 32 magnet pairs are mounted on the inside of the cylindrical portion 221. However, any number of magnet pairs may be used.

The magnets are in close proximity to the coil windings on the stator 252 so that magnetic fields generated by the coils interact with the magnets 242 arranged around the inside of the cylindrical portion 221 of the rotor 240 to cause the rotor 240 to rotate. As the permanent magnets 242 are utilized to generate a drive torque for driving the electric motor, the permanent magnets are typically called drive magnets.

The rotor 240 is attached to the stator 252 by a bearing block 223. The bearing block 223 can be a standard bearing block as would be used in a vehicle to which this motor assembly is to be fitted. The bearing block comprises two parts, a first part fixed to the stator and a second part fixed to the rotor. The bearing block is fixed to a central portion 253 of the wall of the stator 252 and also to a central portion 225 of the housing wall 220 of the rotor 240. The rotor 240 is thus rotationally fixed to the vehicle with which it is to be used via the bearing block 223 at the central portion 225 of the rotor 240. This has an advantage in that a wheel rim and tyre can then be fixed to the rotor 240 at the central portion 225 using the normal wheel bolts to fix the wheel rim to the central portion of the rotor and consequently firmly onto the rotatable side of the bearing block 223. The wheel bolts may be fitted through the central portion 225 of the rotor through into the bearing block itself. With both the rotor 240 and the wheel being mounted to the bearing block 223 there is a one to one correspondence between the angle of rotation of the rotor and the wheel.

FIG. 3 shows an exploded view of the same motor assembly illustrated in FIG. 2 from the opposite side. The rotor 240 comprises the outer rotor wall 220 and circumferential wall 221 within which magnets 242 are circumferentially arranged. As previously described, the stator 252 is connected to the rotor 240 via the bearing block at the central portions of the rotor and stator walls.

A V shaped seal is provided between the circumferential wall 221 of the rotor and the outer edge of the stator.

The rotor also includes a set of magnets 227 for position sensing, otherwise known as commutation magnets, which in conjunction with sensors mounted on the stator allows for a rotor flux angle to be estimated. The rotor flux angle defines the positional relationship of the drive magnets to the coil windings. Alternatively, in place of a set of separate magnets the rotor may include a ring of magnetic material that has multiple poles that act as a set of separate magnets.

To allow the commutation magnets to be used to calculate a rotor flux angle, preferably each drive magnet has an associated commutation magnet, where the rotor flux angle is derived from the flux angle associated with the set of commutation magnets by calibrating the measured commutation magnet flux angle. To simplify the correlation between the commutation magnet flux angle and the rotor flux angle, preferably the set of commutation magnets has the same number of magnets or magnet pole pairs as the set of drive magnet pairs, where the commutation magnets and associated drive magnets are approximately radially aligned with each other. Accordingly, for the purposes of the present embodiment the set of commutation magnets has 32 magnet pairs, where each magnet pair is approximately radially aligned with a respective drive magnet pair.

A sensor, which in this embodiment is a Hall sensor, is mounted on the stator. The sensor is positioned so that as the rotor rotates each of the commutation magnets that form the commutation magnet ring respectively rotates past the sensor.

As the rotor rotates relative to the stator the commutation magnets correspondingly rotate past the sensor with the Hall sensor outputting an AC voltage signal, where the sensor outputs a complete voltage cycle of 360 electrical degrees for each magnet pair that passes the sensor.

For improved position detection, preferably the sensor include an associated second sensor placed 90 electrical degrees displaced from the first sensor.

In the present embodiment the electric motor includes four coil sets 60 with each coil set 60 having three coil sub-sets 61, 62, 63 that are coupled in a wye configuration to form a three phase sub-motor, resulting in the motor having four three phase sub-motors. The operation of the respective sub-motors is controlled via one of two control devices 400, as described below. However, although the present embodiment describes an electric motor having four coil sets 60 (i.e. four sub motors) the motor may equally have one or more coil sets with associated control devices. In a preferred embodiment the motor 40 includes eight coil sets 60 with each coil set 60 having three coil sub-sets 61, 62, 63 that are coupled in a wye configuration to form a three phase sub-motor, resulting in the motor having eight three phase sub-motors. Similarly, each coil set may have any number of coil sub-sets, thereby allowing each sub-motor to have two or more phases.

FIG. 4 illustrates the connections between the respective coil sets 60 and the control modules 400, where a respective coil set 60 is connected to a respective three phase inverter 410 included in a control module 400. As is well known to a person skilled in the art, a three phase inverter contains six switches, where a three phase alternating voltage may be generated by the controlled operation of the six switches. However, the number of switches will depend upon the number of voltage phases to be applied to the respective sub motors, where the sub motors can be constructed to have any number of phases.

Figure 5:
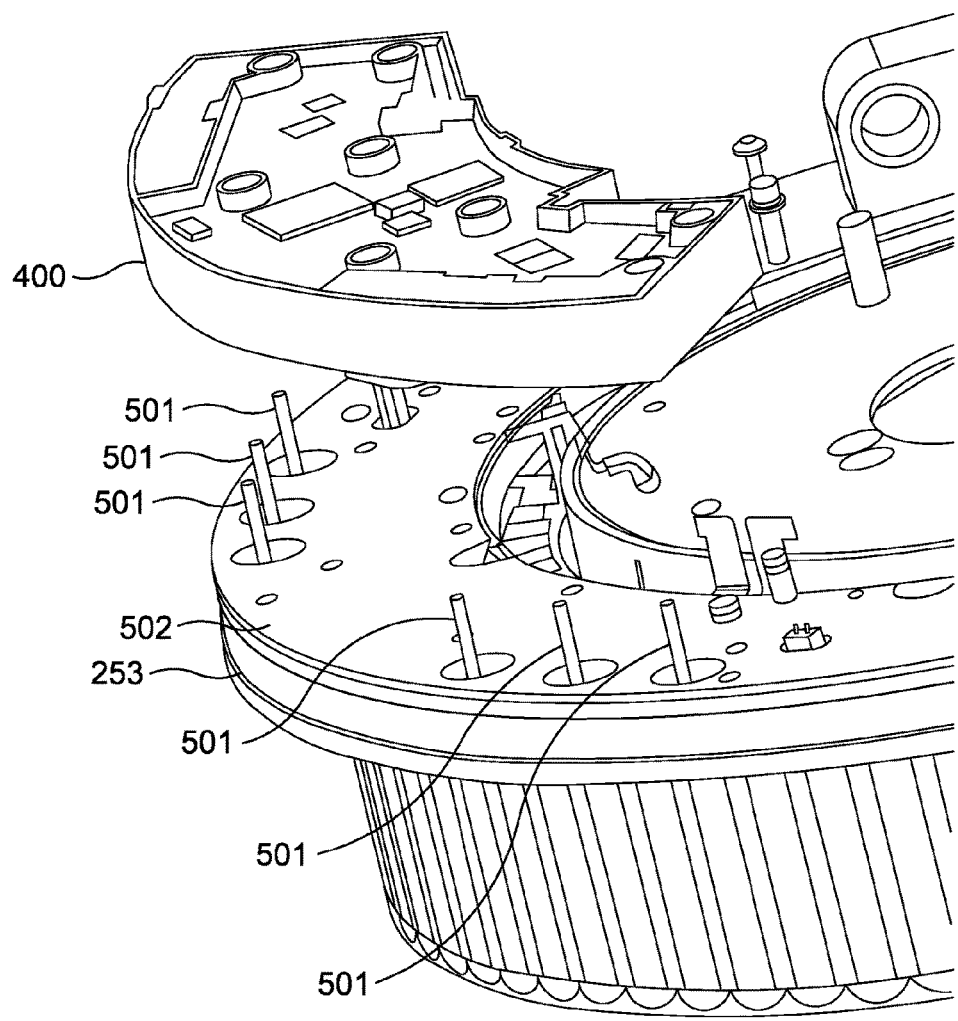
FIG. 5 illustrates a partial view for an electric motor according to an embodiment of the present invention.

The respective coils of the four coil sets are wound on individual stator teeth, which form part of the stator. The end portions 501 of the coil windings protrude through the planar rear portion 502 of the stator, as illustrated in FIG. 5. FIG. 5 illustrates a partial perspective view of the stator, where the end portions 501 of the coil windings for two of the four coil sets 60 extend away from the planar portion of the stator.

The control modules 400 are positioned adjacent to the planar portion of the stator heat sink 253, for mounting to the planar portion of the stator heat sink 253, as described below. For illustration purposes, a view of a single control module 400 separated from the stator heat sink 253 is shown in FIG. 5.

For the purposes of the present embodiment, the planar portion of the heat sink 253 is located on the side of the stator that is intended to be mounted to a vehicle.

Preferably, to facilitate the mounting of the respective control modules 400 to the stator heat sink 253, the end sections 501 of the coil windings for the respective coil sets are arranged to extend away from the heat sink portion of the stator in substantially a perpendicular direction relative to the surface of the heat sink portion of the stator.

Figure 6:
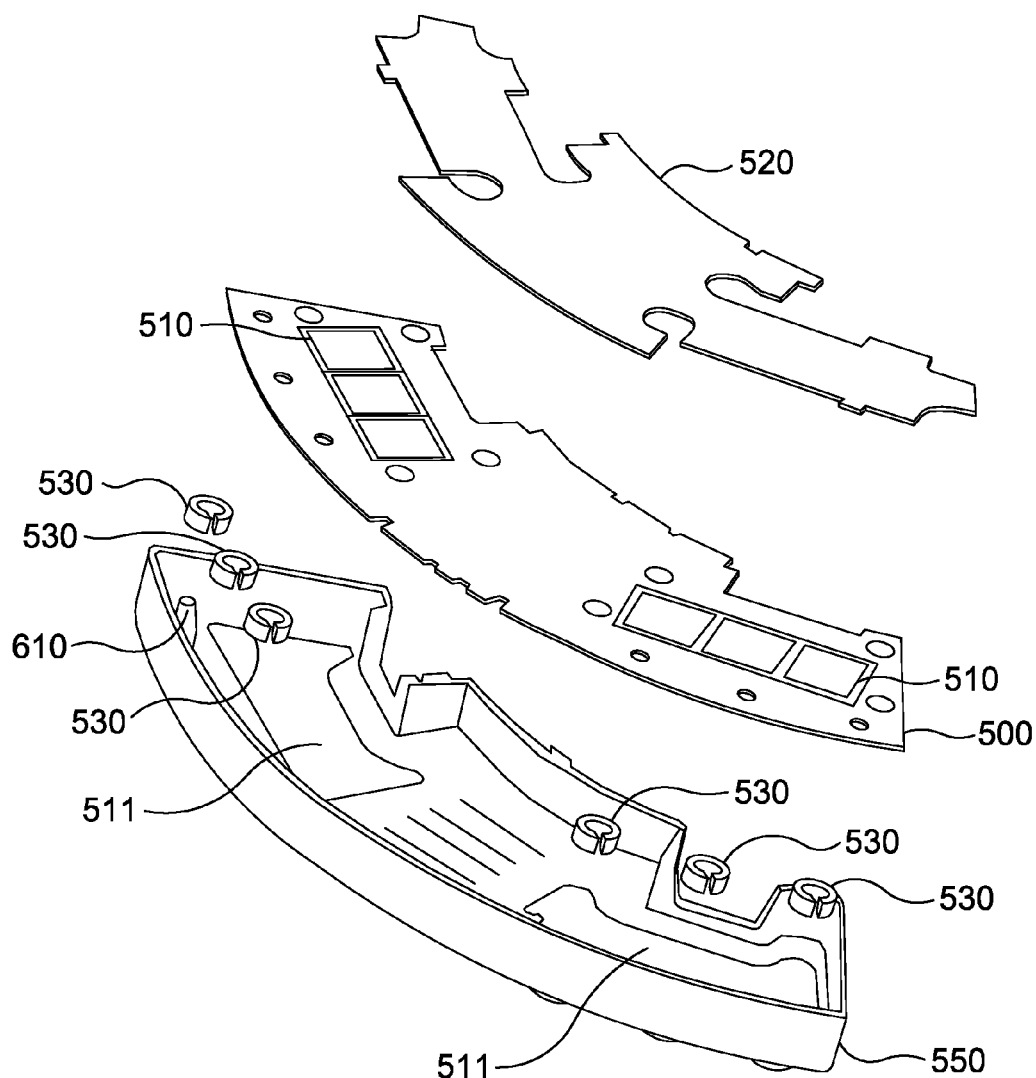
FIG. 6 illustrates a control module for an electric motor according to an embodiment of the present invention.

Preferably, the control modules 400 are of a modular construction. FIG. 6 illustrates an exploded view of a preferred embodiment of a control module 400, where each control module 400, otherwise known as a power module, includes a power printed circuit board 500, having two power substrate assemblies 510, a control printed circuit board 520, four power source busbars (not shown) for connecting to a DC battery, and six phase winding busbars (not shown) for connecting to respective coil windings and six current sensors. Each current sensor includes a Hall sensor and a section of soft ferromagnetic material 530 arranged to be mounted adjacent to the Hall sensor, where preferably each Hall sensor is arranged to be mounted in a cutout section of a piece of soft ferromagnetic material fashioned in a toroid shape.

Soft magnetic materials are those materials that are easily magnetised and demagnetised. They typically have intrinsic coercivity less than 1000 Am-1. They are used primarily to enhance and/or channel the flux produced by an electric current. The main parameter, often used as a figure of merit for soft magnetic materials, is the relative permeability ($\mu r$, where $\mu r = B/\mu_0 H$, which is a measure of how readily the material responds to the applied magnetic field. The other main parameters of interest are the coercivity, the saturation magnetisation and the electrical conductivity.

As soft ferromagnets have a high permeability, low magnetic hysteresis and high saturation, the use of soft ferromagnets, in conjunction with a Hall sensor, allows the accuracy of the current measurement by the Hall sensor to be increase and screen out stray magnetic fields that could contaminate the measured signal.

Types of soft ferromagnets include iron-silicon alloys, amorphous nano-crystalline alloys, nickel-iron alloys and soft ferrites.

However, at high frequencies, which might be encountered within an in-wheel electric motor, metallic soft magnetic materials can suffer from eddy current losses. Therefore, soft ferrites, which are ceramic insulators, are a preferred material.

Each of the control module components are mounted within a control module housing 550 with the four power source busbars and the six phase winding busbars being mounted on the power printed circuit board 500 on opposite sides of the control device housing 550.

Each power substrate 510 is arranged to be mounted in a respective power aperture formed in the power printed circuit board 500, where each of the power substrates 510 has a 3 mm copper base plate 600 upon which is formed a three phase inverter 410. A corresponding aperture is also formed in the control module housing 550 so that the copper base plate for each of the power substrates 510 is placed in direct contact with the stator heat sink 253 when the control device housing 550 is mounted to the stator, thereby allowing for cooling to be applied directly to the base of each of the power substrates 510.

Additionally, mounted on the underside of the power printed circuit board 500, adjacent to the copper base plate of the power substrate assemblies 510, are six Hall sensors (not shown) for measuring the current in the respective coil windings associated with two of the four coil sets. The Hall sensor readings are provided to the control printed circuit board 520.

The power printed circuit board 500 includes a variety of other components that include drivers for the inverter switches formed on the power substrate assemblies 510, however these components will not be discussed in any further detail.

A first pair of the power source busbars is for providing a voltage source to an inverter 410 formed on one of the power substrates assemblies 510. A second pair of the power source busbars is for providing a voltage source to the inverter 410 formed on the other power substrate assembly 510.

For each pair of power source busbars, one of the power source busbars is located in a first plane formed above the plane of the power circuit board 500. The other power source busbar is located in a second plane above the first plane. Preferably, each pair of power source busbars are arranged to be substantially co-planer.

Located in the control module housing 550 on the opposite side of the respective power substrate assemblies 510 to the power source busbars are the six phase winding busbars. A phase winding busbar is coupled to each inverter leg for coupling to a respective coil winding, as is well known to a person skilled in the art (i.e. a phase winding busbar is coupled to each leg of the three phase inverter formed on one of the power substrate assemblies 510 and a phase winding busbar is coupled to each leg of the three phase inverter formed on the other power substrate assembly 510).

The control printed circuit board 520 is arranged to be mounted in the control module housing 550 above the power printed circuit board 500.

The control printed circuit board 520 includes a processor 420 for controlling the operation of the respective inverter switches via the application of field oriented control to allow each of the electric motor coil sets 60 to be supplied with a three phase voltage supply using PWM voltage control across the respective coil sub-sets 61, 62, 63. The three phase voltage supply results in the generation of current flow in the respective coil sub-sets and a corresponding rotating magnetic field for providing a required torque by the respective sub-motors.

Additionally, each control printed circuit board 520 includes an interface arrangement to allow communication between the respective control modules 400 via a communication bus with one control module 400 being arranged to communicate with a vehicle controller mounted external to the electric motor, where the externally mounted controller will typically provide a required torque value to the control module 400. The processor 420 on each control modules 400 is arranged to handle communication over the interface arrangement.

As stated above, although the present embodiment describes each coil set 60 as having three coil sub-sets 61, 62, 63, the present invention is not limited by this and it would be appreciated that each coil set 60 may have one or more coil sub-sets.

PWM control works by using the motor inductance to average out an applied pulse voltage to drive the required current into the motor coils. Using PWM control an applied voltage is switched across the motor windings. During the period when voltage is switched across the motor coils, the current rises in the motor coils at a rate dictated by their inductance and the applied voltage. The PWM voltage control is switched off before the current has increased beyond a required value, thereby allowing precise control of the current to be achieved.

The inverter switches can include semiconductor devices such as MOSFETs or IGBTs. In the present example, the switches comprise IGBTs. However, any suitable known switching circuit can be employed for controlling the current. One well known example of such a switching circuit is the three phase bridge circuit having six switches configured to drive a three phase electric motor. The six switches are configured as three parallel sets of two switches, where each pair of switches is placed in series and form a leg of the three phase bridge circuit. A DC power source is coupled across the legs of the inverter, with the respective coil windings of an electric motor being coupled between a respective pair of switches, as is well known to a person skilled in the art. A single phase inverter will have two pairs of switches arranged in series to form two legs of an inverter.

Using Field Oriented Control, the three phase sinusoidal voltage waveforms generated in the electric motor by the respective control modules 400 for each of the coil sets are represented by respective current vectors that are separated by 120 degrees.

The current vectors represent the instantaneous current in the respective stator coils in the A, B, and C axis of a three phase current reference frame, where the stator current vector is defined by $t_s = i_a + \alpha i_b + \alpha^z i_c$, where $\alpha = e^{(j*2*\Pi/3)}$.

Using a closed loop control system a required torque τ, which is represented by an input iq* value, and a required magnetic flux λ, which is represented by an input id* value, are generated in the electric motor.

The closed loop control system 100 typically includes a Proportional Integral PI controller located between the respective motor input id* and iq* current demands, which correspond to driver torque demand, and the coil windings of the electric motor.

The closed loop control system 100 uses the current sensors mounted in the respective control modules 400 for measuring current flow in the coil windings of the electric motor. To determine the corresponding id and iq current values a Clarke Transform and a Park Transform are used.

A Clarke Transform uses the measured three phase current values ia, ib, and ic to calculate currents in a two phase orthogonal stator axis system iα and iβ. A Park transformation is then performed by a Park Transform to transform the two fixed co-ordinate stator axes ia and to the two co-ordinate time invariant system id and iq, which defines a d, q rotating reference frame.

Under normal drive conditions the rotor phase angle $\theta_r$, otherwise known as rotor flux angle of the drive magnets, which is defined by the rotor magnetic flux vector $\Psi_R$, and the stator electrical phase angle $\theta_e$ should ideally be aligned with the q-axis, thereby maintaining synchronization between the rotor phase angle $\theta_r$ and the stator electrical phase angle $\theta_e$.

To allow the Park Transform 102 to derive a time invariant transformation the rotor phase angle $\theta_r$ is provided to the Park Transform, where the rotor phase angle $\theta_r$ is determined using the rotor commutation magnets and position sensor mounted on the control device 80.

The id and iq values derived from the measured current values are fed back to the respective input id* and iq* current values, where an error value based on the difference between the measured id and iq currents and the driver torque demand (i.e. the id* and iq* current demand) is calculated.

The respective error values for id and iq are fed to the respective PI controller.

Based on the error values provided to the respective PI controller, the PI controllers determine the respective vd and vq values (i.e. the PI controller's manipulated variables) for driving the electric motor. The PWM voltage used to generate the ia, ib, and is currents that flow in respective coil windings are derived from the vd and vq values via the use of an inverse Park Transform, as is well known to a person skilled in the art.

The FOC computation is performed by the processor on the control printed circuit board.

The configuration of the current sensors within the control module housing 550, and their magnetic coupling to the electric motor coil windings, will now be described.

To allow the respective coil windings for two of the four coil sets 60 to be coupled to a respective phase winding busbar within the control module housing 550, the control module housing 550 is arranged to have six apertures 610, where each aperture is sized to allow the end section of a coil winding to be extended into the control module housing 550 when the control module housing 550 is being mounted to the planar portion of the stator heat sink 253.

The six apertures 610 are formed on an outer edge of the control module housing 550 on the side of the housing 550 that is to be mounted adjacent to the planar portion of the stator heat sink 253.

The size and position of the six apertures 610 formed in the control module housing 550 are arranged to match the positions and diameters of the end portions of the coil windings that extend from the planar portion of the stator heat sink 253, thereby allowing the respective end portions of the coil windings to extend through the apertures 610 when the control housing module 550 is mounted on to the planar portion of the stator heat sink 253.

Figure 7:
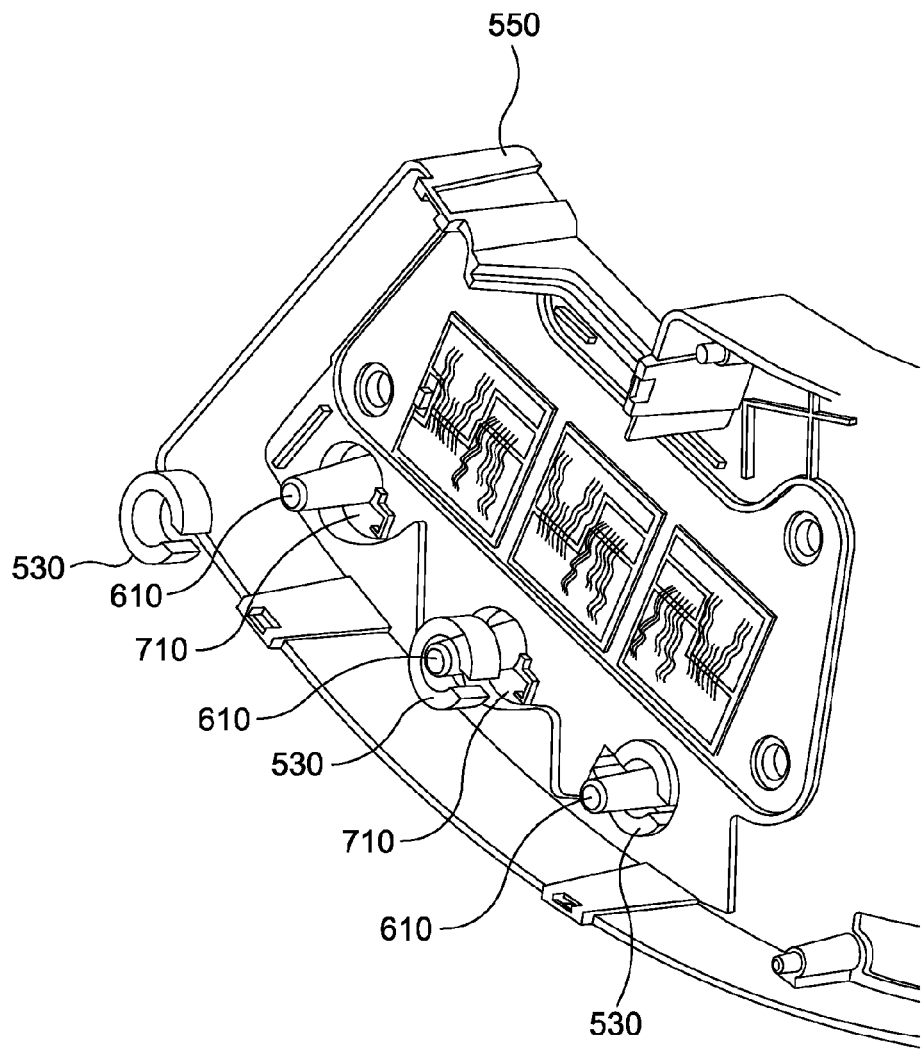
FIG. 7 illustrates a partial view for a control module housing according to an embodiment of the present invention.

A partial perspective view of the control module housing 550 is illustrated in FIG. 7. A recess 710 is formed around each of the six apertures 610 formed in the control module housing 550, where each recess 710 is sized to allow a partial toroid made of soft ferromagnetic material 530, for example a ferrite element, to be located in the recess 710. The top of the partial toroid is arranged to be substantially level with the bottom section of the control module housing 550 when the partial toroid 530 is mounted in a recess 710. The partial toroid of soft ferromagnetic material 530 has a section missing from the toroid that substantially corresponds to the size of the Hall sensor mounted on the power printed circuit board 500. To facilitate the guiding of the coil windings as they pass through the aperture 610, the control module housing 550 is arranged to have a conduit section formed around each aperture 610.

Preferably the recesses 710 formed in the base of the control module housing 550 are keyed to ensure that the partial toroids of soft ferromagnetic material 530 can only be oriented within a recess 710 in a position where the missing section of the toroid is aligned with the position of the Hall sensor mounted on the power printed circuit board 500 when the power printed circuit board 500 is mounted within the control module housing 550.

Once the partial toroids of soft ferromagnetic material 530 have been mounted in the respective recesses 710 formed in the base of the control module housing 550, the power printed circuit board 500 is lowered into position in the control module housing. For illustration purposes, to allow a clear view of the soft ferromagnetic material 530 mounted in the recesses 710 formed in the base of the control module housing 550, FIG. 7 shows a power substrate 510 mounted in an aperture 511 formed in the control module housing 550 without being first mounted to a power printed circuit board. However, as described above, the power substrate will first be mounted to the power printed circuit board before being placed in the control module housing 550. Upon the power printed circuit board 500 being lowered into position in the control module housing 550, as a result of the alignment of the partial toroids of electrical steel 530 and the Hall sensors mounted on the power printed circuit board 500, the Hall sensors mounted on the power printed circuit board 500 are inserted into the missing sections of the respective partial toroids 530 mounted in the control module housing 550.

Each of the phase winding busbars are arranged to include a coupling section, where the coupling section for each phase winding busbar is arranged to extend around a respective aperture 610 formed in the base of the control module housing 550.

Upon an assembled control module 400 being mounted to the planar portion of the stator heat sink 253, the respective end sections of the coil windings for two coil sets 60 that extend away from the planar surface of the stator heat sink 253 (i.e. six coil winding end sections) extend through a respective aperture 610 formed in the base of the control module housing 550, with each of the current sensors mounted in the control module 400 being mounted adjacent to a respective end section of a coil winding.

The respective coupling sections of the phase winding busbars mounted on the power printed circuit board 500 are coupled to a respective end section of a coil winding, where any suitable means may be used to couple the coupling section of the phase winding busbar to a respective end section of a coil winding, for example crimping or welding.

The inverter 410 formed on one power assembly 510, which is coupled via the respective phase winding busbars to a first coil set 60, is arranged to control current in the first coil set. The other inverter 410 formed on the other power assembly 510 in the control module 400 is arranged to control current in a second coil set 60, where the current measurements made by the respective current sensors are used by the processor on the control printed circuit board 520 to control current in the respective coil sets 60.

Similarly, the second control module 400 is arranged to control current in a third and fourth coil set 60.

The invention claimed is:

1. An electric motor or generator comprising a stator with at least one coil winding, wherein the stator includes a heat sink having a first surface having a section of the at least one coil winding arranged to extend through and in a direction away from the first surface, and a control module having a housing with a first side that is arranged to be mounted to the first surface of the heat sink, wherein the housing includes a first element for detecting current flow, and a control device for controlling current flow in the at least one coil winding based upon the current flow detected by the first element, wherein the section of the at least one coil winding that is arranged to extend away from the first surface is arranged to extend through an aperture formed on the first side of the housing for coupling to the control device, wherein the first element is mounted in the housing adjacent to the section of the at least one coil winding, wherein the first side of the housing includes a recess formed around the aperture on the opposite surface to that mounted adjacent to the first surface of the heat sink for mounting the first element.

2. An electric motor or generator according to claim 1, wherein the first element is mounted in the housing adjacent to the aperture or adjacent to the control device.

3. An electric motor or generator according to claim 1, wherein the first element is mounted in the housing between the first side of the housing and the control device.

4. An electric motor or generator according to claim 1, wherein the at least one coil winding is arranged to extend in a direction substantially perpendicular away from the first surface of the heat sink.

5. An electric motor or generator according to claim 1, wherein the first element is arranged to extend substantially around the aperture.

6. An electric motor or generator according to claim 1, wherein the first element includes a Hall sensor and an soft ferromagnet component.

7. An electric motor or generator according to claim 6, wherein the soft ferromagnet component is configured as a toroid with a section of the toroid replaced with the Hall sensor.

8. An electric motor or generator according to claim 1, wherein the section of the at least one coil winding that is arranged to extend through the aperture is arranged to extend through substantially the center of the first element.

9. An electric motor or generator according to claim 1, wherein the control device is a circuit board having an inverter.

10. An electric motor or generator according to claim 1, wherein the stator includes a coil set arranged to produce a magnetic field of the motor, the coil set comprising a plurality of coil windings, wherein a section of each of the plurality of coil windings extend in a direction away from a first surface of the stator, wherein the section of each of the plurality of coil windings that are arranged to extend away from the first surface of the stator are arranged to extend through a respective aperture formed on the first side of the housing and an aperture formed in a respective first element for coupling to the control device.

11. An electric motor or generator according to claim 1, wherein the stator includes two coil sets arranged to produce a magnetic field of the motor, each coil set comprising a plurality of coil windings, wherein a section of each of the plurality of coil windings extend in a direction away from a first surface of the stator, wherein the section of each of the plurality of coil windings that are arranged to extend away from the first surface of the stator are arranged to extend through a respective aperture formed on the first side of the housing and an aperture formed in a respective first element for coupling to the control device, wherein the current flow in the plurality of coil windings of a first coil set is controlled via a first inverter mounted on the control device and the current flow in the plurality of coil windings of a second coil set is controlled via a second inverter mounted on the control device.

* * * * *